United States Patent [19]

Bunkofske

[11] Patent Number: 5,705,223
[45] Date of Patent: Jan. 6, 1998

[54] METHOD AND APPARATUS FOR COATING A SEMICONDUCTOR WAFER

[75] Inventor: Raymond James Bunkofske, South Burlington, Vt.

[73] Assignee: International Business Machine Corp., Armonk, N.Y.

[21] Appl. No.: 568,333

[22] Filed: Dec. 5, 1995

Related U.S. Application Data

[63] Continuation of Ser. No. 280,627, Jul. 26, 1994, abandoned.

[51] Int. Cl.$^6$ ...................................................... B05D 3/12
[52] U.S. Cl. ........................... 427/240; 118/52; 427/348; 427/378; 427/385.5
[58] Field of Search .................... 427/240, 348, 427/378, 231, 385.5; 118/52

[56] References Cited

U.S. PATENT DOCUMENTS

| | | | |
|---|---|---|---|
| 4,113,492 | 9/1978 | Sato et al. | 96/67 |
| 4,510,176 | 4/1985 | Cuthbert et al. | 427/82 |
| 4,518,678 | 5/1985 | Allen | 430/311 |
| 4,668,334 | 5/1987 | Doornveld | 427/240 |
| 4,685,975 | 8/1987 | Kottman et al. | 134/33 |
| 4,838,979 | 6/1989 | Nishida | 118/52 |
| 4,903,717 | 2/1990 | Sumnitsch | 118/52 |
| 5,238,713 | 8/1993 | Sago et al. | 427/240 |
| 5,279,926 | 1/1994 | Chandler et al. | 430/311 |

*Primary Examiner*—Janyce Bell
*Attorney, Agent, or Firm*—Thornton & Thornton; David R. Thornton

[57] ABSTRACT

These desirable results and other objects of the present invention are realized and provided by depositing coating material on a front surface of a rotating wafer to spread a thin film over this surface while directing a light positive pressure of clean gas over the backside of the spinning wafer to preclude deposits of gas borne particles of the coating material thereon. Solvent application for removal of edge coating can be employed simultaneously with, or subsequent to, the deposit of coating material on the front surface In the apparatus, the wafer is mounted for rotation over the open end of a containment member terminating at its top in a ring surface to define a central chamber encircled at its top by a narrow radial channel, and the chamber is lightly pressurized from a source of gas, uncontaminated by coating material, to produce a steady flow of clean gas outwardly through said channel into balance at the edge of the wafer with a particle containing gas flow from the front surface to thereby exclude unwanted distributions of coating material or solvent to the wafer.

21 Claims, 2 Drawing Sheets

METHOD AND APPARATUS FOR COATING A SEMICONDUCTOR WAFER

The application is a continuation of application Ser. No. 08/280,627, filed Jul. 26, 1994 now abandoned.

FIELD OF THE INVENTION

This invention relates to an apparatus and method for coating a semiconductor wafer, and more particularly a spin coating apparatus and method for controlling unwanted deposits on a semiconductor wafer during the deposition of the material on a select surface thereof.

BACKGROUND OF THE INVENTION

Photolithographic techniques utilized in the manufacturing of semiconductor products require coating a surface of a semiconductor substrate or wafer with photosensitive material, such as a photoresist coating, followed by patterning, etching and diffusion or plating, etc. In the present state of the art, the coating is deposited in a spin coating apparatus wherein the wafer is chuck mounted and spun at relatively high speeds as a drop of coating liquid is applied to the center thereby spreading a thin, substantially uniform coating of the deposited material over the wafer responsive to centrifugal force.

In present arrangements, the coating not only spreads across the top, or front surface, of the wafer as just described, but is also carried to the edge and to the underside of the wafer.

Unfortunately, these coating deposits on the edge and underside of the wafer are detrimental to the manufacturing of semiconductive circuit chips since particles from such deposits will often find their way to the front surface of the wafer. Moreover, any coating on the underside or edge can also transfer to the tools and fixtures utilized for further processing of the wafer thereby spreading contamination to other wafers throughout the manufacturing line. One specific example is the contamination of the wafers stage in an exposure tool. Particles of dried photoresist from the back of the wafer deposit on the stage and prevent proper focusing of the desired image.

In present practice, to preclude the unwanted distribution and contamination, the coating is removed from the edge and underside following its deposition. For example, U.S. Pat. No. 5,279,926 issued Jan. 12, 1994 to Chandler et al., utilizes application of a photoresist solvent to a peripheral area of the bottom surface of a spinning wafer to remove the photoresist coating inadvertently deposited in that area during its deposition on the upper surface. U.S. Pat. No. 4,510,176 issued Apr. 9, 1985 to Cuthbert et al., discloses applying resist solvent to the periphery of the top surface of a spinning wafer to remove edge coating, and includes a baffle mounted over the top surface to preclude the looping of gasses over the front surface which can produce detrimental deposits on the top surface of both the solvent and coating removed from the periphery.

U.S. Pat. No. 4,113,492, issued to Sato et al. on Sep. 12, 1978, teaches simultaneously applying coating solvent to a peripheral portion of the underside of a wafer in a spin coating apparatus while depositing the coating on the topside. Whereas, U.S. Pat. No. 4,518,678, issued May 21 1985 to Allen discloses repeatedly contacting a peripheral portion of the underside of a slowly spinning wafer with coating solvent, and spinning the wafer at successively higher speeds to remove the dissolved coating.

While the just noted patents teach the removal of detrimental sections of coating, they fail to preclude coating from initially reaching the back surface of the wafer or to eliminate the distribution of removed coating to parts of the wafer.

Finally, U.S. Pat. No. 4,685,975 issued to Kottman et al. on Aug. 11, 1987 teaches removing coating from the edge and a peripheral portion of the back surface of a wafer by applying solvent to a peripheral area of the rear surface of a spinning wafer. The patent discloses a cylindrical housing mounted beneath the wafer and terminating in a ring close to the underside of the wafer, with one embodiment disclosing a solvent nozzle formed within a slot in the ring surface. While this patent provides a cylindrical support beneath the wafer, there is no teaching of blocking particle laden gases from reaching the back surface of the wafer.

SUMMARY OF THE INVENTION

An object of the present invention is to provide an improved semiconductor wafer coating process and apparatus which controls undesirable deposits on the wafer.

It is another object of the invention to provide a spin coating method and apparatus which, during application of material to the front surface of a semiconductor wafer, precludes deposits of such material upon the backside thereof.

It is yet another object of the invention to provide a spin coating method and apparatus which eliminates unwanted deposition of material upon the backside of a semiconductor wafer and redistribution of removed material to the front surface.

It is a further object of the invention to provide a spin coating method and apparatus which precludes deposition of the coating material on the backside of a semiconductor the wafer and also distribution of removed coating and coating solvent to the front side.

It is a still further object of the invention to provide a novel method and apparatus for removing deposited material from the edge of a semiconductor wafer while precluding distribution of removed material and solvent to the front and back surfaces surface of the wafer.

These desirable results and other objects of the present invention are realized and provided during deposition of coating on the front surface of a semiconductor wafer, or removal of coating from the wafer, by delivering a steady flow of clean gas over the backside of the wafer and radially outward thereof to exclude deposits of gas borne particles of coating from the backside. Preferably, the flow of clean gas is also delivered to the wafer edge in a substantially laminar flow in general balance with the flow of gas from the front surface to eliminate turbulence at the wafer edge, and thereby prevent undesired conveyance of gas borne particles of the coating back to the top surface of the wafer.

The method is facilitated by spinning the wafer over the open end of a containment member having a ring shaped top surface closely spaced from the backside of the wafer in adjoining relation to the periphery thereof thereby forming a small chamber with the backside and a narrow channel between it and the ring surface, and lightly pressurizing the chamber from a source of clean gas to produce a constant, steady flow radially outward in said channel and into a generally balanced relation to gas flow from the front surface at the wafer edge.

These and other objects, features, and advantages of the invention will be apparent from the following more particular description of the preferred embodiment of the invention as illustrated in the accompanying drawings.

DESCRIPTION OF THE PREFERRED EMBODIMENT

Figure 1:
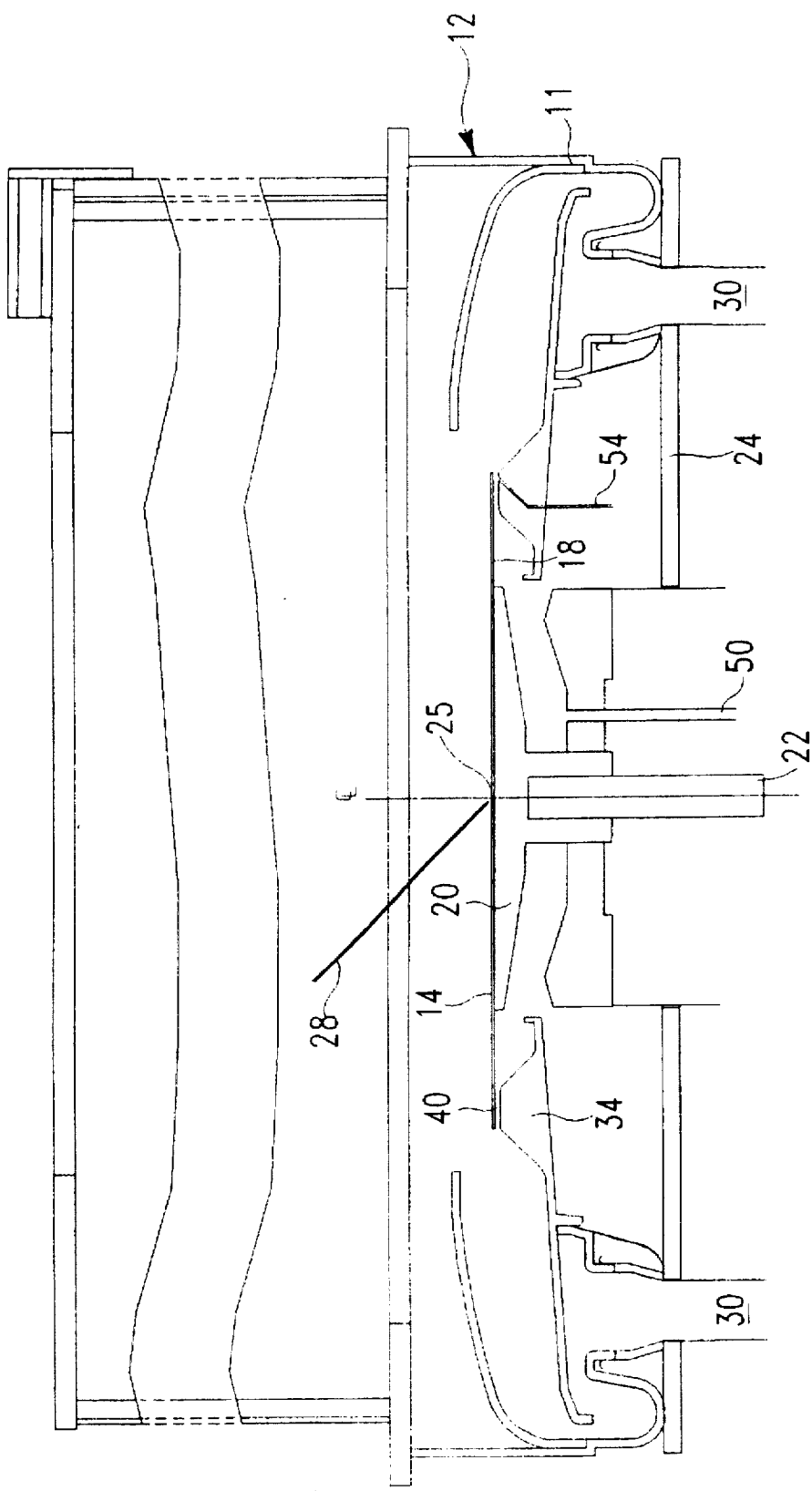
FIG. 1 is a partly diagrammatic view in section of a spin coating apparatus provided in accordance with the invention.
Figure 2:
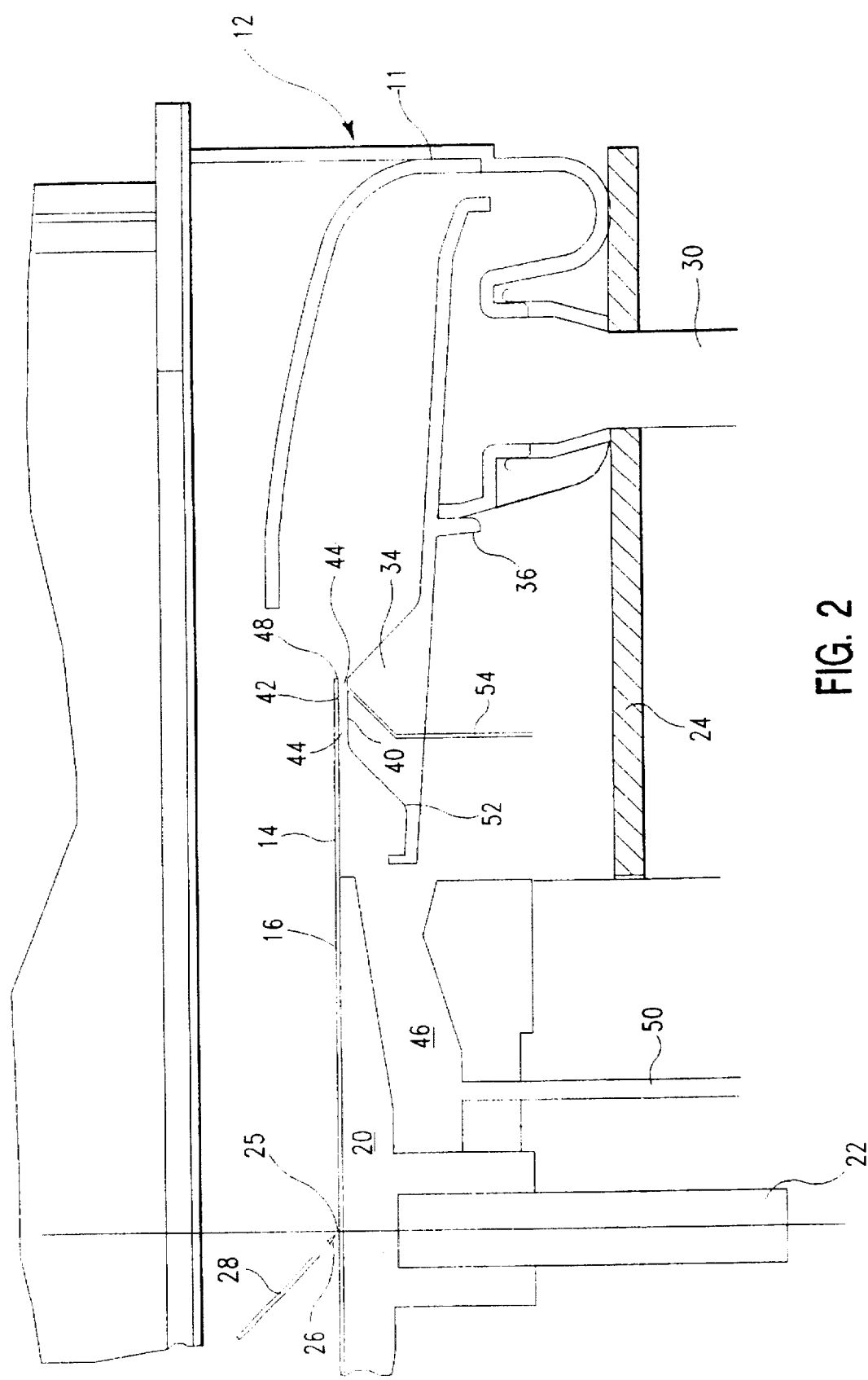
FIG. 2 is an enlarged sectional view of the apparatus of the invention taken along the center line of FIG. 1.

Referring now to the drawings and particularly FIG. 1, a spin coating apparatus 10 constructed in accordance with the invention will be described. As illustrated, the spin coating apparatus 10 utilizes an exterior housing 12 comprising a generally cylindrical sidewall 11 which rises from a base plate 24 to encircle a semiconductor wafer 14. The wafer 14 is mounted on a turntable or rotary chuck 20, such as a conventional vacuum chuck, for rotation about an axis substantially normal to the planar surfaces of the wafer, respectively designated as 16 for the top or front surface, and as 18 for the bottom or back surface. In turn, the chuck 20 is affixed to, and supported by a rotary shaft 22, driven by conventional means such as an electrical motor (not shown) or other rotary device.

To control vapors generated within the apparatus during its operation, an exhaust outlet extends from the housing 12, as illustrated for example by the exhaust conduit 30. The latter pierces the base plate 24, and is in communication with a pump (not shown) to provide a slight draft on the interior of the housing 12 so as to remove vapors therefrom.

In operation, as the wafer 14 is rotated, a drop of coating material (not shown), such as a photoresist, is supplied to the center 25 of the front surface 16 of the wafer by means of a coating nozzle 26, supplied through a coating inlet 28. This drop of coating material is accordingly spread, as a thin layer, over the surface 16 due to centrifugal force.

The rotation of the chuck 24 and wafer 14, mounted thereon, produces a flow of gas radially outward of the front and back surfaces 16 and 18 and disperses, or throws the coating material from the wafer edge 48. As the coating material leaves the wafer it forms small droplets of coating material. Consequently, although clean gas, such as air, is present, at atmospheric pressure, in the interior of the housing 12, the deposition of coating material in combination with the wafer rotation results in the particles of material being entrained in the gas flowing across the front surface of the wafer.

For example, many of the coating particles thrown from the wafer edge 48 are entrained in the gas flow from the top surface. As a result, the gas within the housing 12 becomes contaminated with the coating material. Some of this contaminated, or particle containing gas, circulates within the housing 12 and deposits gas borne particles on the surfaces of the wafer 14, including the back surface 18.

In accordance with the invention, a containment ring or containment member 34 is mounted beneath the wafer 14 in attachment to the housing wall 11 by support elements 36. The containment member 34 is formed as an open, shallow member having a planar ring surface 40.

As illustrated, the containment member 34 is centered beneath the wafer 14 and the chuck 20, with its ring surface 40 closely spaced to a peripheral portion 42 of the wafer back surface 18. This forms a narrow ring shaped channel 44 and a chamber 46 between the back surface 18 and the member 34, with the channel providing an opening from the chamber 46 to the wafer edge 48.

The channel 44 and the chamber 46 facilitate the application of a steady flow of clean gas to the wafer back surface 18 so as to preclude coating particles from reaching that surface. That is, a flow of clean gas is supplied across the back surface 18 to prevent the particle carrying gas from the front surface 16 from reaching the back surface 18. The clean gas is preferably supplied as a continuous, steady flow of gas, rather than static gas, to exclude any diffusion of particles thereto from the particle containing gas in the housing 12 and to facilitate a balance of gaseous flow at the edge 48 of the wafer.

To create this slight positive pressure differential outwardly through the channel and across the wafer surface 18 to ensure a flow of clean gas across the back surface 18, an air or gas inlet 50 coupled to a suitable gas source (not shown) is provided. This gas inlet 50 extends from the chamber 46 through the containment member 34 and from the housing 12 for supplying the chamber 46 with clean gas, such as clean compressed air independent of any other gas available within the housing 12. To facilitate such pressurization of the chamber 46, the base plate 24 is closely fitted to the rotary shaft 22.

The clean gas supplied through inlet 50, unlike the gas within the housing, is uncontaminated by particles of the coating being deposited on the top surface. Accordingly, the backside 18 of the wafer 14 is precluded from receiving gas borne particles present within the apparatus housing 12.

To reduce edge turbulence, the radial length of the channel 44 is made large as compared to its height in order to provide a laminar flow of the gas prior to its exit from the channel. That is, a fully developed fluid profile is provided in channel 44 in the channel. The inner diameter of the ring surface 40 is made slightly greater than the diameter of the chuck 20 to accommodate the chuck 20 and the outer diameter of the ring surface 40 is preferably made substantially equal to the diameter of the wafer 14 to minimize edge turbulence.

In the preferred embodiment, the channel 44, defined between the ring surface 40 and the back surface 18 of the wafer 14, is one millimeter (1 mm) in height and the chamber 46 is pressurized to one millimeter of mercury (1 mm of Hg) above atmospheric pressure. This provides a steady, continuous flow of clean, i.e. uncontaminated, gas across the wafer backside 18 and a flow, at the wafer edge 48, balanced with the flow on the front surface 16.

A channel as high as three or four millimeters can be satisfactory. However, the larger gap will increase the difficulty in keeping a suitable pressure in the chamber.

For removal of edge coating, a solvent inlet 54 extends from the channel 44 through the containment member 34 and from the housing 12 to a source of solvent (not shown) for delivery of a jet of solvent to the edge 48 of the wafer 14 during its rotation.

While it is not anticipated that appreciable amounts of solvent will pass through the channel to the interior of the ring 34, any such excess solvent can be removed therefrom by a drain outlet (not shown) extending from the low point 52 of the ring to outside of the apparatus housing 12.

In the operation of the apparatus 10, the wafer 14 is spun by the chuck 20 at relatively high speed and a small amount of coating material, such as a drop, is applied to the center 25 of the wafer front surface 16 by means of the nozzle 26. Responsive to rotation, the coating material spreads over the top surface 16 and to the edge 48 of the wafer 14 by centrifugal force. A solvent may also be applied to the wafer underside 18 during coating deposition, or subsequent thereto, for removal of coating material from the wafer edge 48.

As can readily be understood, the rotational speed of the wafer is varied depending upon the coating material applied, and can in some cases fall below 100 rpm, however, spinning rates more commonly range from 1000 to 6000 rpm. As previously indicated, in this type of coating apparatus, centrifugal force from the rotation of the wafer 14 causes a radial flow of gas over both the front surface 16 and back surface 18 of the wafer and from its edge 48.

Additionally, there is a slight flow of gas due to the exhaust draft from the outlet 30. However, with the usual high spinning speeds of a few thousand rpm, the dominant flow of gas is that due to centrifugal force.

Gas flowing within the apparatus housing 12, particularly the gas flowing over the wafer front surface 16, picks up coating particles which, in turn, are deposited on various portions of the wafer. For example, particles of the coating material, thrown radially from the edge 48 by centrifugal force, are picked up and carried by the gas flowing from the front surface 16, and produce unwanted deposits on the wafer back surface 18.

In accordance with the invention, the flow of gas from the front surface 16, with any gas particles borne thereby, are excluded from the wafer back surface 18 by the independent delivery of a flow of clean gas (that is, gas uncontaminated by coating particles) across the back surface. Additionally, the clean gas is also delivered across the back surface 18 to the wafer edge 48 in balance with the gas flow from the front surface 16 to reduce turbulence at the edge, and thereby prevent unwanted distribution to the front surface, of gas borne coating particles, or of solvent when the latter is employed.

Thus, a primary factor is to deliver uncontaminated air, or gas, to the back surface 18 since this excludes the deposition of gas borne coating particles on this surface. However, it is also important to deliver the clean gas at the wafer edge 48 in a laminar flow in balance with the gas flow from the front surface to minimize turbulence at the wafer edge 48, since any such turbulence can distribute gas borne particles or solvent to the front surface 16.

To facilitate both delivery of clean gas to the back surface 18, and the balancing of gas flows at the wafer edge 48, the back surface 18 is essentially closed off from any particle contaminated gas within the housing 12 by the ring 34 in conjunction with the base plate 24 to form chamber 46. This chamber 46 is supplied with a clean air or gas, under a light pressure, which is additionally directed through the channels 44, in laminar flow, to balance, at the wafer edge 48, the flow of gas from the front surface 16.

Stated otherwise, the chamber 46 is lightly pressurized from a clean source (not shown) of gas which in turn, feeds through the channel 44 to the wafer edge 48 where it is in general balance with front surface gas flow. To ensure laminar flow of the independently delivered gas at the wafer edge 48, the channel 44 extends just to the wafer edge 48 and is sufficiently wide (as radially measured) as compared to its height so as to provide a fully developed fluid profile, and thus laminar flow of the clean gas prior to its exit from the channel.

A width of ten to fifteen times the height of the channel is sufficiently long to provide the fully developed fluid profile in the channel. To achieve this with a channel of 1 mm in height, the radial width of the ring surface 40 (defining the ringed flat of the channel) is made 10 to 15 mm. Consequently, for a 200 mm wafer, the inside diameter of the planar ring surface ranges from 160 to 170 mm, and the outside diameter is 200 mm.

To efficiently maintain a positive pressure while minimizing losses from the chamber 46, the channel 44 is preferably constructed to define the largest opening from the chamber. That is, other losses from the chamber, for example, gas leakage about the rotary shaft, or from communicating inlets or outlets are kept small as compared to the cross sectional area of the channel. Further, the channel 44 is limited in height, which reduces the gas flow therethrough.

With a pressurization of 1 mm of mercury, the lengthy channel 44 automatically provides a laminar gas flow at the wafer edge 48, which is substantially in balance with the air flow from the front surface 16.

As previously indicated, the apparatus 10 includes an inlet 54 by which solvent can be delivered to the wafer periphery to dissolve and remove coating deposited on the wafer edge 48 with little fear of distributing the removed coating or solvent back to the wafer 14. For efficiency of operation, the solvent is preferably utilized simultaneously with deposition of the coating. However, it can alternatively be employed at a time subsequent thereto. In either event, the invention is utilized to maintain the underside free from coating particles and the coated top surface free from either unwanted coating particles or the solvent.

This follows, from the fact that since the back surface 18 is only exposed to its own independent supply of clean gas, other gas flows which carry particles of the removed coating are excluded therefrom. Moreover, since the gas streams from the front and back surfaces 16 and 18 are in balance at the wafer edge 48, the removed coating, and the solvent, also will not be distributed to the front surface of the wafer 14.

As described herein, solvent is applied to the periphery of the underside of the wafer, however, it should be understood that it could alternatively be applied to the periphery of the front surface 16.

It should also be understood that in order to facilitate construction, the containment member 34 is preferably made stationary with the apparatus housing 12, however, the method and apparatus will still function in accordance with the invention, while rotating the containment member 34 with the wafer. Further, the chamber 46, while not absolutely necessary to the invention, facilitates the delivery of a steady, radially outward flow of clean gas in balance with the flow from the top surface 16.

Consequently, the chamber volume is primarily determined in accordance with the apparatus to which it is fitted, and good results have been obtained, for example, with chamber volumes ranging from twelve cubic inch to one cubic foot.

The invention has been described with regard to conventional spin coating apparatus in which the coating material is deposited on an upward facing surface of a semiconductor wafer, and the containment member 34 therefor adjoins the bottom surface. However, the top and bottom orientation of the wafer is not important. Thus, the containment member 34 adjoins the side of the wafer opposite the surface upon which the coating material is applied, and it should be realized that the latter can be downward facing with the containment member 34 adjoining the uppermost, or top surface of the wafer.

This completes the description of the preferred embodiment of the invention. Since changes may be made in the above process without departing from the scope of the invention described herein, it is intended that all the matter contained in the above description or shown in the accompanying drawings shall be interpreted in an illustrative and not in a limiting sense. Thus other alternatives and modifications will now become apparent to those skilled in the art without departing from the spirit and scope of the invention as set forth in the following claims.

What is claimed is:

1. A method for coating a surface of a semiconductor wafer having a front and back surface, the method comprising the steps of:
   a) depositing a coating material on said front surface;
   b) rotating said wafer to spread said coating material over said front surface, said rotation producing a flow of gas containing particles of said coating material radially outward of said front surface; and
   c) directing a steady flow of clean gas radially outward of said back surface of said wafer in a laminar flow at the wafer edge, and into substantially matching relation with the flow thereat of the particle containing gas to preclude the gas borne particles thereof from reaching said back or front surface.

2. The method of claim 1 including positioning an open ended containment member in spaced relation to said back surface of said wafer, said containment member terminating at its said open end in a top ring surface, said wafer having a peripheral portion of its said back surface spaced from said ring surface to define a channel between said peripheral portion and said ring surface with a chamber internally thereof, the outer diameter of said ring surface being at least substantially equal to the diameter of said wafer such that said channel extends at least to the edge of said wafer, said ring surface having a large radial width as compared to the spacing of said back surface from said ring surface so that the gas flow through said channel will be in laminar flow at its exit from said channel, and said directing step includes pressurizing said channel from a source of substantially clean gas to provide a laminar flow thereof outwardly through said channel into said matching relation at the wafer edge with said flow of gas from said front surface.

3. The method of claim 2 wherein said pressurizing step includes pressurizing said chamber to a pressure of approximately one millimeter of mercury (1 mm of Hg) so that the gas flow through said channel will be generally in balance at the edge of said wafer with the gas flow from said front surface.

4. The method of claim 3 including spacing said wafer from one to four millimeters (1–4 mm) from said ring surface.

5. The method of claim 4 wherein said back surface of said wafer is mounted on a chuck of given diameter, the inner diameter of said ring surface is greater than the given diameter of said chuck to provide a small chamber having a volume in the order of 12 cubic inches, and the radial width of said channel is sufficiently large as compared to the height thereof so that the gas flow through said channel will have laminar flow prior to its exit from said channel.

6. The method of claim 1 including the step of directing a solvent of said coating to a peripheral portion of said wafer to remove coating therefrom as said wafer is rotated to spread said coating material over said front surface.

7. A method for removing coating material from an edge of a semiconductor wafer having front, back and edge surfaces, said wafer having coating material deposited on said front and edge surfaces of said wafer, the method comprising the steps of:
   a) directing solvent of said coating material to point on a peripheral area of one of said surfaces of said wafer;
   b) rotating said wafer to deliver said solvent over said peripheral area to dissolve and remove coating material thereon, said rotation producing a flow of gas radially outward of said front surface and resulting in said flow from said front surface carrying particles of said removed coating material and solvent; and
   c) directing a steady flow of clean gas radially outward of said back surface of said wafer in a laminar flow at the wafer edge, and into substantially matching relation with the flow thereat of the particle containing gas to preclude the gas borne particles thereof from reaching said back or front surface.

8. A spin coating apparatus for coating a surface of a semiconductor wafer having a front and back surface, the apparatus comprising:
   a) an apparatus housing;
   b) coating dispensing means extending within said housing for directing coating material to a centrally located point on a front surface of a wafer;
   c) chuck means positioned within said housing for engaging a rear surface of a wafer so as to present a front surface thereof to said coating dispensing means to receive said coating material and for rotating the engaged wafer to spread said coating material over its front surface, said rotation producing a flow of gas, carrying particles of said coating, radially outward of said front surface;
   d) an open ended containment member terminating at its open end in a ring surface spaced from a peripheral portion of the back surface of an engaged wafer to define a narrow channel of large radial width between said ring surface and said back surface, the outer diameter of said ring surface being at least substantially equal to the diameter of said wafer such that said channel extends at least substantially to the edge of said wafer, and said ring surface having a radial width sufficiently larger than its spacing from said wafer to provide, when said member is pressurized, a laminar gas flow outwardly from said channel; and
   e) pressurizing inlet means extending into said chamber for pressurizing said chamber from a source of clean gas, independent of gases within said housing, to provide a steady flow of said clean gas outwardly through said channel in laminar flow at the edge of the engaged wafer, and into substantially matching relation to the flow thereat of said particle containing gas from the front surface to preclude the gas borne particles thereof from reaching said back and front surface.

9. The apparatus of claim 8 wherein said radial width of said channel is at least ten times the height of said channel to provide a fully developed fluid profile in said channel.

10. The apparatus of claim 9 wherein said ring surface of said containment member is spaced one millimeter (1 mm) from said back surface of said engaged wafer, and the radial width of said channel is at least ten millimeters.

11. The apparatus of claim 8 wherein said engaged wafer is mounted on a chuck of given diameter, the inner diameter of said ring surface is greater than the given diameter of said chuck to provide a small chamber having a volume in the order of 12 cubic inches, and said pressurizing inlet means includes means for pressurizing said chamber to direct a flow of said clean gas to the edge of said wafer in general balance with said gas flow from the front surface of said wafer to preclude distribution of unwanted material to portions of said wafer.

12. The apparatus of claim 11 including solvent inlet means extending within said housing and to said channel, and said solvent inlet means configured for communication with a source of coating solvent for application of said solvent to the edge of said wafer to remove coating material deposited on said edge.

13. The apparatus of claim 11 wherein said pressurizing inlet means includes means for pressurizing said chamber to a pressure of approximately one millimeter of mercury (1 mm of Hg) so that said gas flow through said channel will be generally in balance with the front surface gas flow at the edge of said wafer.

14. The apparatus of claim 11 wherein said ring surface of said containment member is spaced one millimeter (1 mm) from said back surface of said wafer.

15. The apparatus of claim 11 wherein said ring surface of said containment member is spaced one to four millimeters (1–4 mm) from said back surface, and said pressurizing inlet means includes means for pressurizing said chamber to a pressure of approximately one millimeter of mercury (1 mm of Hg) so that the gas flow through said channel will be generally in balance with the front surface gas flow at the edge of said wafer.

16. The apparatus of claim 15 including solvent inlet means for communication with a source of coating solvent for application of the solvent to the wafer edge to remove coating material deposited thereon.

17. A spin coating apparatus for removing coating from the edge surface of a semiconductor wafer having a front, back and an edge surface, the apparatus comprising:
 a) an apparatus housing;
 b) solvent dispensing means extending within said housing for directing solvent of said coating to a peripheral area of a wafer;
 c) chuck means positioned within said housing for mounting and rotating a wafer to present a peripheral area thereof to said solvent dispensing means so as to deliver said solvent to said peripheral area to remove coating therefrom, said rotation producing a flow of particle containing gas, carrying particles of both removed coating and said solvent, radially outward of said front surface;
 d) an open ended containment member terminating at its open end in a ring surface closely spaced from a peripheral portion of a back surface of said mounted wafer to define a chamber between said member and said back surface and a narrow channel of large radial width between said ring surface and said peripheral portion, said ring surface having a radial width sufficiently larger than its spacing from said wafer to provide, when said member is pressurized, a laminar gas flow outwardly from said channel, and the outer diameter of said ring surface being at least substantially equal to the diameter of said wafer such that said channel extends at least to the edge of said wafer; and
 e) pressurizing inlet means extending into said chamber for pressurizing said chamber from a source of clean gas, independent of gases within said housing, to provide a steady flow of said clean gas outwardly through said channel in laminar flow at the edge of the mounted wafer and into substantially matching relation to the flow thereat of said particle containing gas from the front surface to preclude the gas borne particles thereof from reaching said back and front surface.

18. The apparatus of claim 17 wherein said pressurizing inlet means includes means for lightly pressurizing said chamber to provide a laminar flow of said clean gas at the edge of said wafer in general balance with said gas flow from said front surface to reduce turbulence thereat and preclude distribution of removed coating or solvent to said front surface.

19. A method for coating a surface of a semiconductor wafer having a front and back surface, the method comprising the steps of:
 a) depositing a coating material on said front surface;
 b) rotating said wafer to spread said coating material over said front surface, said rotation producing a flow of gas containing particles of said coating material radially outward of said front surface; and
 c) directing a flow of clean gas radially outward of said back surface of said wafer into substantially matching relation with the flow at the wafer edge of the particle containing gas to preclude the gas borne particles thereof from reaching said back or front surface, said directing step including positioning an open ended containment member in spaced relation to said back surface of said wafer, said containment member terminating at its said open end in a top ring surface, said wafer having a peripheral portion of its said back surface spaced from said ring surface to define a channel between said peripheral portion and said ring surface with a chamber internally thereof, said channel extending substantially to the edge of said wafer, said ring surface having a relatively wide top surface providing a channel of large radial width as compared to its height, and said directing step includes pressurizing said channel from a source of substantially clean gas to provide a flow thereof outwardly through said channel into said matching relation at the wafer edge with said flow of gas from said front surface, and the outer diameter of the ring surface of said containment member is substantially equal to the diameter of said wafer such that said channel substantially extends to the edge of said wafer.

20. A spin coating apparatus for coating a surface of a semiconductor wafer having a front and back surface, the apparatus comprising:
 a) an apparatus housing;
 b) coating dispensing means extending within said housing for directing coating material to a centrally located point on a front surface of a wafer;
 c) chuck means positioned within said housing for mounting and rotating a wafer to spread said coating material over a front surface thereof, said rotation producing a flow of gas, carrying particles of said coating, radially outward of said front surface;
 d) an open ended containment member terminating at its open end in a ring surface closely spaced from a peripheral portion of a back surface of a mounted wafer to define a narrow channel between said ring surface and said back surface, said channel extending substantially to the edge of said mounted wafer, and said ring surface having a relatively wide top surface providing a channel of large radial width as compared to its height; and
 e) inlet means extending into said containment member for pressurizing said channel from a source of clean gas: independent of said gas from said front surface and free of the particles borne thereby, to provide a steady flow of said clean gas outwardly through said channel into substantially matching relation to the flow at said wafer edge of the particle containing gas from said front surface to preclude the gas borne particles thereof from reaching said back or front surface, and the outer diameter of the ring surface of said containment member is substantially equal to the diameter of said wafer such that said channel substantially extends to the edge of said wafer.

21. A spin coating apparatus for removing coating from the edge surface of a semiconductor wafer having a front, back and an edge surface, the apparatus comprising:

a) an apparatus housing;

b) solvent dispensing means extending within said housing for directing solvent of said coating to a peripheral area of a wafer;

c) chuck means positioned within said housing for mounting and rotating a wafer to deliver said solvent to the edge surface of the mounted wafer to remove coating therefrom, said rotation producing a flow of particle containing gas, carrying particles of both removed coating and said solvent, radially outward of the front surface of said wafer:

d) an open ended containment member terminating at its open end in a ring surface closely spaced from a peripheral portion of a back surface of said mounted wafer to define a chamber between said member and said back surface with an open narrow channel defined between said ring surface and said back surface, said channel extending substantially to the edge of said wafer, and said ring surface having a relatively wide top surface providing a channel of large radial width as compared to its height; and e) pressurizing inlet means extending into said containment member for pressurizing said chamber from a source of clean gas, independent of gases within said housing, to provide a steady flow of said clean gas outwardly through said channel into substantially matching relation to the flow at said wafer edge with said flow of particle containing gas from said front surface to preclude the gas borne particles thereof from reaching said back or front surface, and the outer diameter of the ring surface of said containment member is substantially equal to the diameter of said wafer such that said channel substantially extends to the edge of said wafer.

* * * * *